United States Patent [19]

Rao et al.

[11] 4,110,776

[45] Aug. 29, 1978

[54] SEMICONDUCTOR INTEGRATED CIRCUIT WITH IMPLANTED RESISTOR ELEMENT IN POLYCRYSTALLINE SILICON LAYER

[75] Inventors: G. R. Mohan Rao; John S. Stanczak; Jih-Chang Lien; Shyam Bhatia, all of Houston, Tex.

[73] Assignee: Texas Instruments Incorporated, Dallas, Tex.

[21] Appl. No.: 727,116

[22] Filed: Sep. 27, 1976

[51] Int. Cl.$^2$ ............... H01L 29/78; H01L 27/02; H01L 29/04
[52] U.S. Cl. ........................... 357/23; 357/51; 357/59; 357/91
[58] Field of Search ............ 357/23, 51, 59, 91; 307/303

[56] References Cited

U.S. PATENT DOCUMENTS

| B 504,503 | 3/1976 | Vamada | 357/59 |
|---|---|---|---|
| 3,576,478 | 4/1971 | Watkins | 357/59 |
| 3,975,221 | 8/1976 | Rodgers | 357/59 |
| 4,033,797 | 7/1977 | Dill et al. | 357/91 |

OTHER PUBLICATIONS

IBM Technical Bulletin; *Trimming of Ion Implanted Resistors*, vol. 13, No. 6, Nov. 1970, p. 1698.
IBM Technical Bulletin by Freeman et al., vol. 14, No. 11, Apr. 1972, p. 3338.
IBM Technical Bulletin, Ion Implanted Polycrystalline Silicon FET Gates; vol. 16, No. 9, Feb. 1974, p. 2901.

*Primary Examiner*—Andrew J. James
*Attorney, Agent, or Firm*—James T. Comfort; John G. Graham

[57] ABSTRACT

Resistor elements for MOS integrated circuits are made by an ion implant step compatible with a self-aligned N-channel silicon-gate process. The resistor elements are in a part of a polycrystalline silicon layer which is also used as a gate for an MOS transistor and as an interconnection overlying field oxide. Resistors of this type are ideally suited for load devices in static RAM cells.

21 Claims, 17 Drawing Figures

SEMICONDUCTOR INTEGRATED CIRCUIT WITH IMPLANTED RESISTOR ELEMENT IN POLYCRYSTALLINE SILICON LAYER

BACKGROUND OF THE INVENTION

This invention is directed to semiconductor devices and methods of making such devices, and more particularly to an improved resistor element for MOS integrated circuits.

In the earliest semiconductor integrated circuits, resistors were provided by diffused regions or by portions of the semiconductor substrate which were defined by etching, as seen in U.S. Pat. No. 3,138,743 issued to Jack S. Kilby and assigned to Texas Instruments. As the complexity of integrated circuits grew, the area occupied by resistors became more and more prohibitive, so logic forms were favored which did not require resistors. For example, "TTL" or transistor-transistor logic in bipolar was standard in digital equipment for a long period, and one of the features of TTL was minimizing the area on a bar dedicated to resistors. Integrated injection logic or I²L if a more recent bipolar form which does not need resistors. In MOS logic and memories, transistors are used as load devices or in other places where resistors are conventionally required. Examples of very complex MOS circuits containing many thousands of transistors but no resistors in a single chip digital processor or memory are shown in U.S. Pat. No. 3,940,747, issued to Kuo and Kitagawa and U.S. Pat. No. 3,900,722, issued to Michael J. Cochran et al, both assigned to Texas Instruments.

High density MOS memory devices such as the 4096 bit memory described in U.S. Pat. No. 3,940,747, or the "16K" or 16384 bit memory described in pending application Ser. No. 682,687, filed May 3, 1976, by N. Kitagawa, have been of the dynamic type because dynamic cells are smaller in area. In some parts of digital equipment, however, the refresh circuitry required for dynamic memories is incompatible, so static memory is used. Static cells traditionally employ six-transistor bistable or flip-flop circuits wherein depletion-load MOS transistors are used as load devices. These cells are much larger than the one-transistor cells of dynamic memory devices, so the density is less. Also, power dissipation is high due to the requirement that some current must flow through one side of each cell in the array to maintain the stored data.

In co-pending application Ser. No. 691,252, filed May 28, 1976, assigned to Texas Instruments, there is disclosed a resistor element particularly for a static RAM cell wherein the resistors are implanted regions buried beneath field oxide. With the resistor element of this invention, access time and layout are improved.

It is a principal object of this invention to provide improved resistor elements for integrated circuits. Another object is to provide an improved static RAM cell for MOS memory devices. An additional object is to provide small area, high resistance load elements for transistors in semiconductor integrated circuits.

SUMMARY OF THE INVENTION

In accordance with the invention, a resistor element is provided in an N-channel, silicon-gate MOS integrated circuit by an ion-implanted area in an elongated strip of polycrystalline silicon which extends over the field oxide, usually contacting a transistor on one end. The resistor area is doped at a much lower level than the remaining areas of the strip which are highly conductive. Preferably, the resistor area is implanted at a dosage of about $5 \times 10^{13}$ to $1 \times 10^{14}$ phosphorus atoms per cm², at 100 to 150 KeV, and the strip should not be thicker than about 0.5 micron. The resistor is sealed with a silicon oxide coating over the resistor area of the polysilicon strip.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
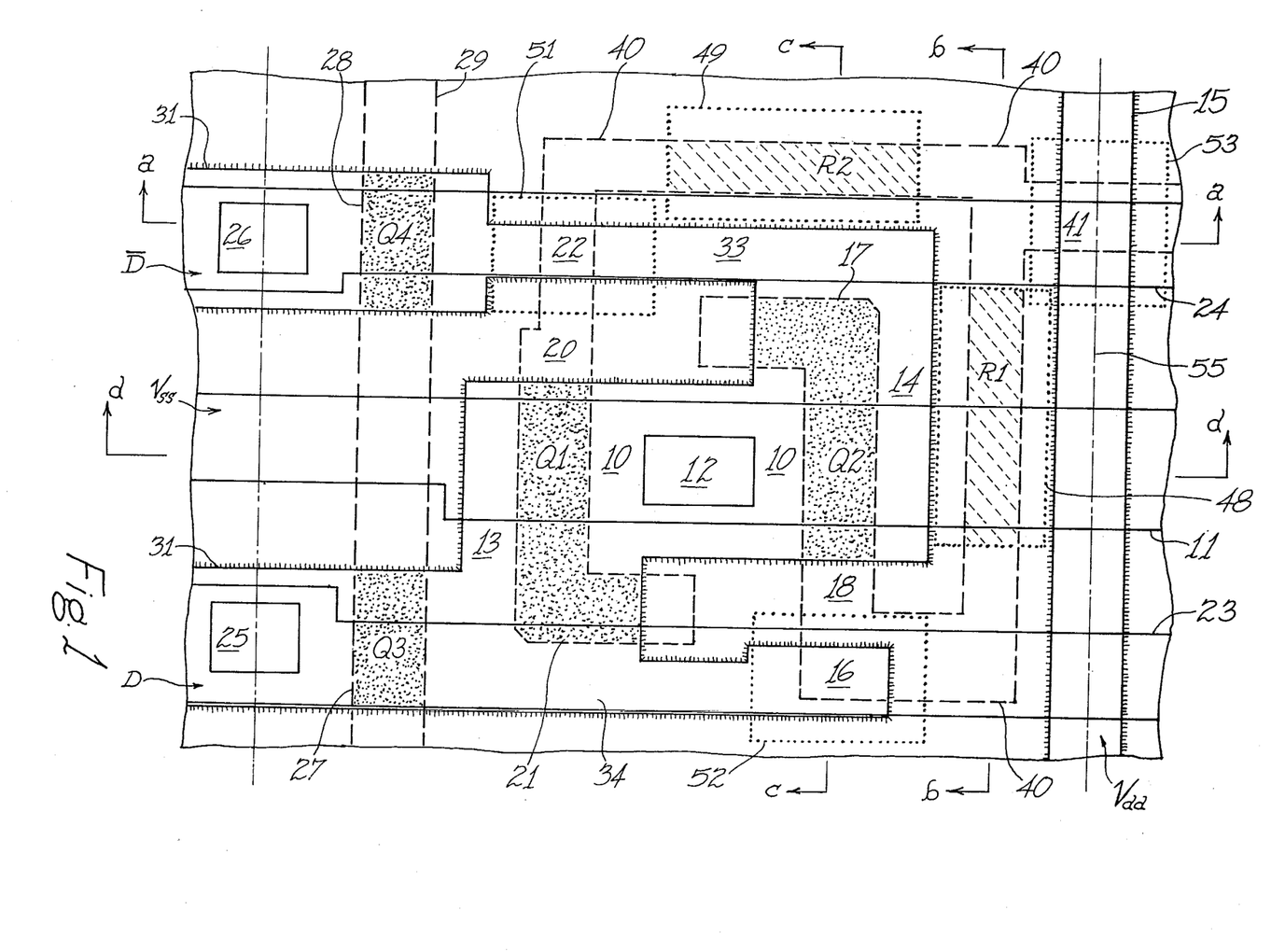
FIG. 1 is a greatly enlarged plan view of a small portion of a semiconductor chip showing the physical layout of a RAM cell using the resistors of the invention.

Referring to FIG. 1, a physical layout is shown of an N-channel silicon gate MOS static RAM cell which utilized the resistors of the invention. This cell is of course greatly enlarged in FIG. 1, as it would actually occupy only about four square mils, i.e., the larger dimension of the cell of FIG. 1 would be less than about 2.5 mils. The same cell is also shown in FIG. 2 drawn as an electrical schematic diagram, with the parts numbered the same.

Figure 2:
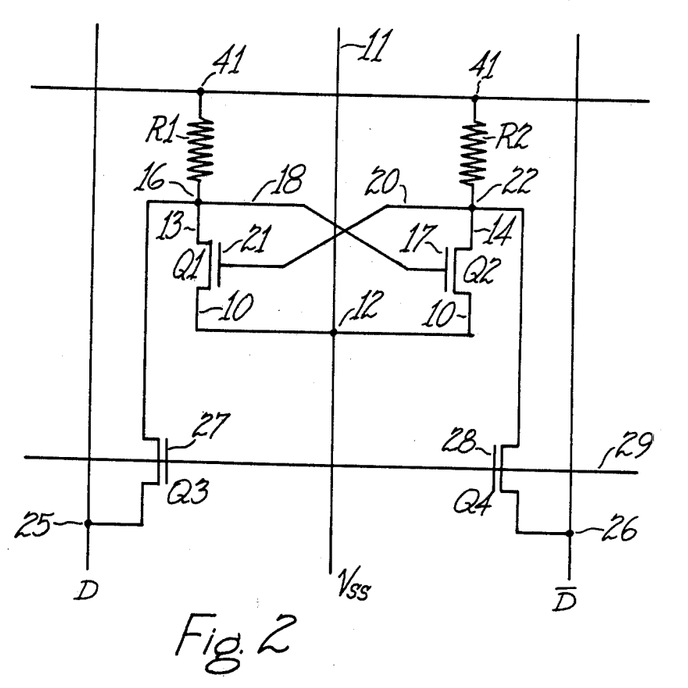
FIG. 2 is an electrical schematic diagram of the RAM cell of FIG. 1.

The cell of FIGS. 1 and 2 consists of a pair of cross-coupled driver transistors Q1 and Q2, each of which has a source 10 in the form of an N+ region connected to a metal strip which is ground or Vss line 11 at a metal-to-moat contact 12. Each transistor has an N+ drain region 13 or 14 which is electrically connected to a Vdd or positive supply line 15 through a resistor R1 or R2. the resistors R1 and R2 are formed by ion implantation in a polycrystalline silicon layer according to the invention. The Vdd supply line 15 is an elongated N+ diffused moat region. A node 16 at the drain 13 of the transistor Q1 is connected to a polysilicon gate 17 of the transistor Q2 via a polysilicon conductor 18, and in like manner a polysilicon conductor 20 connects the poly gate 21 of the transistor Q1 to a node 22 at the drain 14 of the transistor Q2, providing the cross-coupling characteristic of a bistable or flip-flop circuit. Metal strips which provide digit lines 23 and 24 (usually referred to as D and D, or as D0 and D1) are connected to the nodes 16 and 22 via coupling transistors Q3 and Q4 metal-to-moat contacts 25 and 26. The gates 27 and 28 of these transistors Q3 and Q4 are connected to (actually part of) a word address line 29 which is a polysilicon strip.

Referring to FIGS. 3a–3d, sectional views of the cell of FIG. 1 show the details of construction. The cell is a small part of a substrate 30 of P-type silicon. The transistors Q1, Q2, Q3 and Q4 are formed in an elongated continuous moat 31 in which N+ diffused regions 32, 33, 14, 10, 13 and 35 create the source and drain regions. A thin silicon oxide gate dielectric layer 36 and phosphorus-doped polysilicon areas 17, 21, 27 and 28 form the gates of these transistors. The polysilicon strips which form the gates 27 and 28 are parts of the elongated strips which include the cross-coupling interconnects 18 and 20. The field oxide 37 exists at all areas where N+ diffused regions or transistors do not exist, and a P+ boron-doped channel-stop region 38 is created under all areas of the field oxide 37. An insulating layer 39 is formed over the entire top surface, overlying the polysilicon, the field oxide 37, and the N+ regions. The lines 11, 23, and 24 are metal strips overlying this insulating layer 39.

Figure 3A:
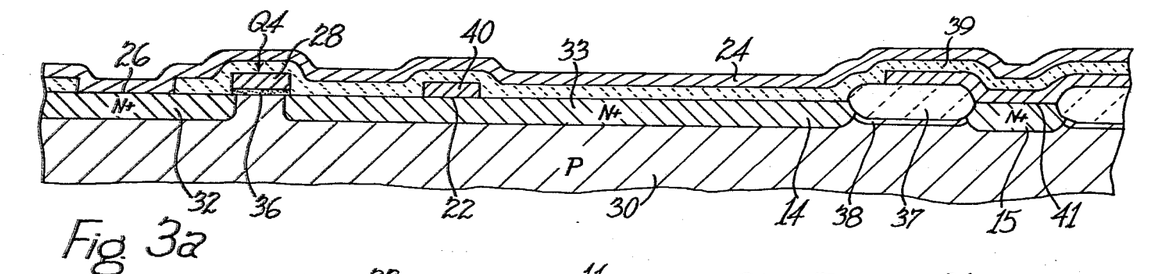
FIG. 3a–3d are elevation views in section of the cell of FIG. 1, taken along the lines a—a, b—b, c—c and d—d, respectively.
Figure 3B:
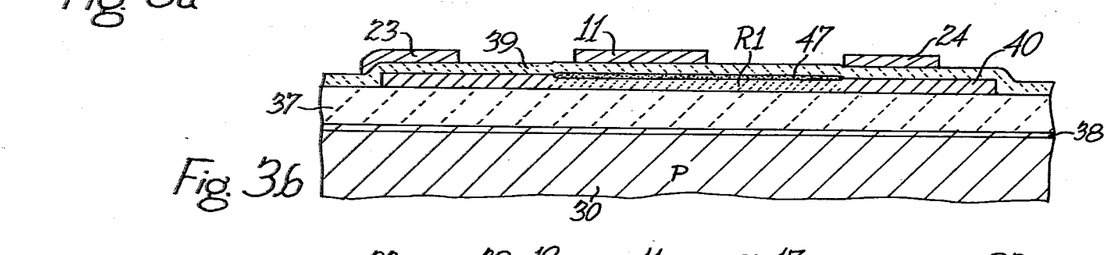
Figure 3C:
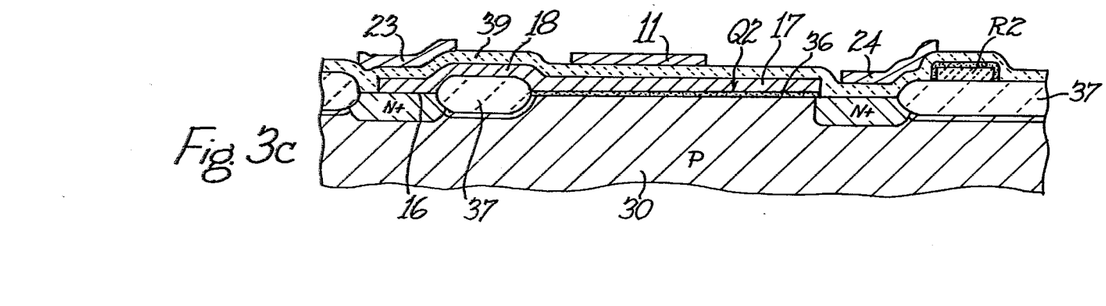

As seen in FIG. 3b, the resistor R1, according to the invention, consists of a phosphorus ion implanted portion of an elongated polycrystalline silicon strip 40. The strip 40 extends in an unbroken path from one end of the gate 17, the cross-couple interconnect 18, the contact 16, the resistor R1, a contact 41 to Vdd line 15, the resistor R2, the contact 22, the interconnect 20, through to the end of the gate 21. The remainder of the strip 40, except for the resistors R1 and R2, is heavily doped with phosphorus so that it will be highly conductive. The size of the resistor R1 (as well as R2) is about 0.15 mil × 0.75 mil in area as seen in plan view of FIG. 1, and about 5,000A in thickness as seen in a section view as FIG. 3b. The resistor R2 is seen in FIG. 3c, where the resistor comprises a phosphorus implanted region extending the width of this part of the strip 40 of polysilicon.

Figure 3D:
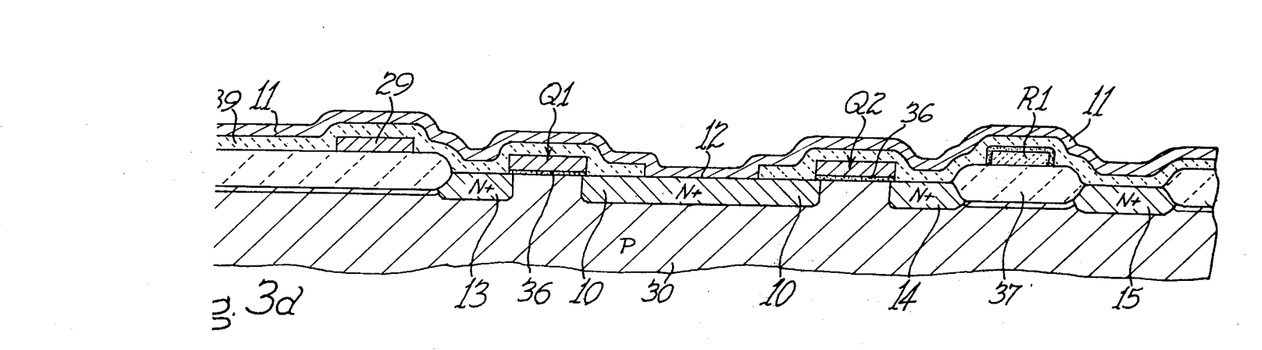
Figure 4A:
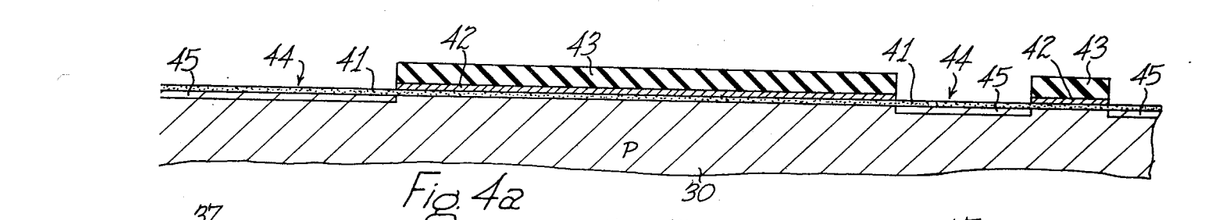
FIG. 4a–4d are elevation views in section of the semiconductor device of FIGS. 1 and 3d, at successive states in the manufacturing process, taken along the line d—d in FIG. 1.

Referring now to FIGS. 4a–4e, a process for making the N-channel, silicon-gate, self-aligned MOS integrated circuit device of FIGS. 1 and 3a–3d will be described. The starting material is a slice of P-type monocrystalline silicon, perhaps 3 inches in diameter and 20 mils thick, cut on the <100> plane, of a resistivity of about 6 to 8 ohm-cm. In FIGS. 3d or 4a, a wafer or body 30 represents a very small part of the slice, chosen as a representative sample cross section. First, after appropriate cleaning, the slice is oxidized by exposing to oxygen in a furnace at an elevated temperature of perhaps 1000° C to produce an oxide layer 41 of a thickness of about 1000A. Next, a layer 42 of silicon nitride $Si_3N_4$ is formed by exposing to an atmosphere of silane and ammonia in an rf reactor. This nitride layer 42 is grown to a thickness of about 1000A. A coating 43 of photoresist is applied to the entire top surface, then exposed to ultraviolet light through a mask which defines the desired pattern, and developed. This leaves areas 44 where nitride is to be etched away; these are the areas where field oxide 37 is to be grown. The slice is subjected to a plasma etch, which removes the part of the nitride layer 42 not covered by the exposed photoresist 43, but does not remove the oxide layer 41 and does not react with the photoresist 43.

The slice is now subjected to an ion implant step, whereby boron atoms are implanted in the areas 44 of silicon not covered by photoresist 43 and nitride 42. The photoresist could have been removed, but preferably is left in place as it masks the implant. Boron is an impurity which produces P-type conductivity, so a more heavily doped P+ region 45 will be produced in the surface. The oxide layer 41 is left in place during the implant because it prevents the implanted boron atoms from out-diffusing from the surface during subsequent heat treatment. The boron implant is at a dosage of about $4 \times 10^{12}/cm^2$ at 100 KeV. After the implant, the photoresist layer 43 is removed.

As will be seen, the regions 45 do not exist in the same form in the finished device, because some of this part of the slice will have been consumed in the oxidation procedure. The implanted regions 45 will utimately produce the P+ channel stop regions 38.

As set forth in U.S. Pat. No. 4,055,444, issued Oct. 25, 1977 to G. R. Mohan Rao, assigned to Texas Instruments, the next step in the process is to subject the slice to a heat treatment or annealling step, during which the slice is maintained at a temperature of about 1000° C for perhaps approximately 2 hours in an inert atmosphere, preferably nitrogen. This step causes the boron concentration to change markedly, which has desirable effects aside from reduction in bulk damage in the crystal structure. The P+ regions 45 have now penetrated deeper into the silicon surface.

Figure 4B:
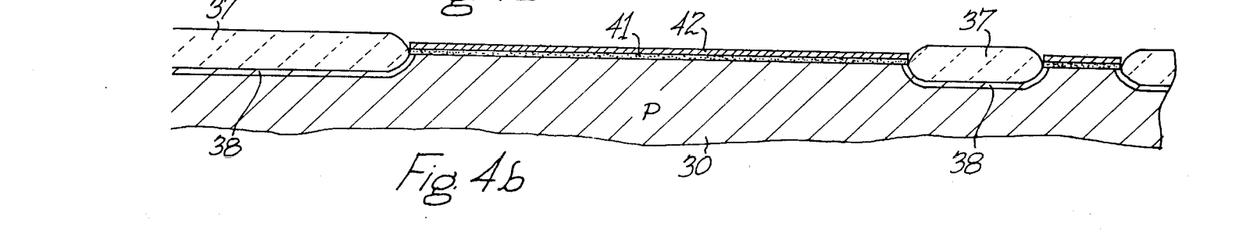

The following step in the process is formation of field oxide, which is done by subjecting the slices to steam or an oxidizing atmosphere at about 900° C for perhaps 10 hours. As seen in FIG. 4b, this causes a thick field oxide region or layer 37 to be grown, and this region extends into the silicon surface because silicon is consumed as it oxidizes. The nitride layer 42 masks oxidation beneath it. The thickness of this layer 37 is about 8000 to 10,000A, half of which is above the original surface and half below. The boron doped P+ region 45 as previously implanted and modified by the anneal step will be partly consumed, but will also diffuse further into the silicon ahead of the oxidation front. Thus, the P+ regions 38 will result which will be deeper and of more uniform and acceptable concentration at the surface compared to what would have resulted without the anneal step. Also, the regions 38 will not have the extent of crystalline structure damage characteristic of implanted devices.

The nitride layer 42 and its underlying oxide layer 41 are removed by etching, as the next step, and another thin silicon oxide layer 36 of about 8000A is grown over the exposed areas of silicon.

At this time, although not reflected in FIGS. 4b or 4e, two ion implant steps are performed to create the desired threshold or operating parameters in transistors in the integrated circuit. First, boron is implanted at 50 KeV to a dosage of about $2.5 \times 10^{11}$ atoms per $cm^2$ for the purpose of adjusting the threshold voltage of thin oxide enhancement mode transistors so that substrate bias voltage will not be needed. Then, a photoresist layer is applied and patterned to expose the channel areas of depletion load transistors in peripheral circuitry, not in the cell array. These areas are then subjected to a phosphorus implant at 150 KeV with a dosage of about $1 \times 10^{12}$ per $cm^2$. This phosphorus implant is selected to produce high speed devices in the peripheral circuits, whereas if depletion load transistors had been used in place of the resistors R1 and R2 in the cell array then attaining low standby power dissipation would have been the most important factor and so speed in terms of access time would be compromised.

Windows for polysilicon to substrate contacts are patterned and etched using photoresist removing the gate oxide layer 41 in selected areas such as the contact areas 16 and 22. Next, a layer of polysrystalline silicon is deposited over the entire slice in a reactor using standard techniques, for example by decomposition of silane in hydrogen at about 930° C to a thickness of 0.4 to 0.6 micron, producing the polysilicon which will ultimately form the strip 40 and the line 29.

The entire polycrystalline silicon coating is now subjected to the phosphorus implantation which creates the characteristics of the resistors R1 and R2. Areas of polysilicon which are to be highly conductive will be later subjected to a phosphorus diffusion which will leave them heavily doped. To define the resistor characteristics, this implant step is performed at 100 to 150 KeV to a dosage of from $5 \times 10^{13}$ to $1 \times 10^{14}$ phosphorus atoms per cm$^2$, depending upon the desired sheet resistivity for the resistors. Following this phosphorus implant for the resistors, the slices are annealed in an N$_2$ atmosphere for 30 minutes at 1000° C; this is for the purpose of distributing the phosphorus properly in the polysilicon.

As reported by Bean et al., Journal of Applied Physics, Vol. 40, No. 5, pp 2358-2359, April 1969, the resistivity of undoped polysilicon at room temperature is about $5 \times 10^4$ to $5 \times 10^5$ ohm-cm with an apparent P-type concentration of $2.1 \times 10^{11}$ to $5.8 \times 10^{11}$/cm$^3$, and a mobility of 33 to 430 cm$^2$/voltsec. This was in crystals, but in polysilicon as the thickness is decreased to one micron or less, the conduction will be along grain boundries, so resistivity in such case will be at least as high as $10^5$ ohm-cm. The sheet resistance in such case will be $[R_s] \times [1/d]$ or $10^5 \times 1/(0.5 \times 10^{-4})$ which is approximately $2 \times 10^8$ ohm per square. This would be too unstable with temperature and too highly resistive. The phosphorus implant serves to produce a resistivity of ideally about 1 to 5 megohms per square at 25° C. Lower resistivity results in too large cell size, and higher results in instability, non-reducibility and voltage dependence.

Figure 4C:
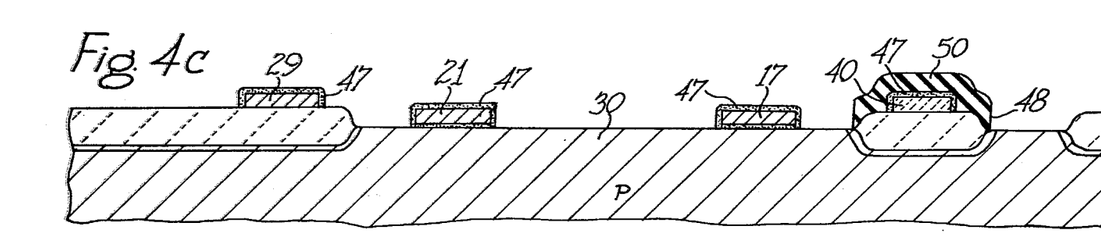
Figure 4D:
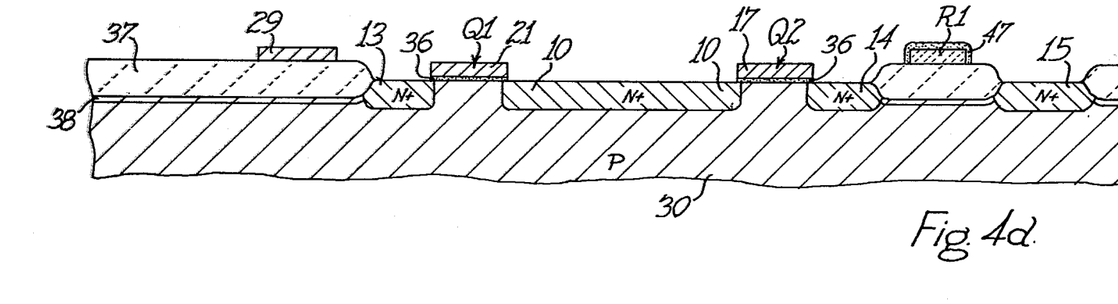

The polysilicon coating and the underlying gate oxide or thin oxide layer 36 are next patterned. This is done by applying a layer of photoresist, exposing to ultraviolet light through a mask prepared for this purpose, developing, then etching with the remaining photoresist masking certain areas of the polysilicon. The resulting structure is seen in FIG. 4c, where a part of the remaining polysilicon layer provides what will be the gate 21 of the transistor Q1, the gate 17 of the MOS transistor Q2, and thin oxide underneath it is the gate oxide 36 of the transistors. Further the polysilicon strip 29 is left in place by this masking and etching operation, as well as the entire elongated strip 40 in which the resistors R1 and R2 are formed. These same layers also provide gate and gate oxide for all the other transistors on the slice, and where needed, capacitors, wherein the thin oxide 36 is the dielectric layer and the polysilicon layer, acting merely as a conductor, is one plate of a capacitor.

After patterning the polysilicon to provide the strips 40 and 29 of FIG. 1, a protective cap of silicon dioxide is grown on the polysilicon, producing a coating 47 on all exposed surfaces of the poly, including tops and sides. The layer 47 is grown at about 900° C in steam for about 2 hours, producing approximately 3000A thickness and consuming part of the polysilicon. Alternatively, the cap may be about 0.2 or 0.3 micron thickness of Si$_3$N$_4$ grown in a plasma reactor. The function of the cap is to prevent deposition of impurities on the resistors or diffusion into the resistors. A photoresist masking and etching operation is then used to remove the coating 47 on all areas of polysilicon except the resistors R1 and R2. The mask used to protect the resistor leaves oxide over areas defined in FIG. 1 by dotted lines 48 and 49; these are much wider than the resistors, functioning to permit rather wide margin for error in mask alignment. In FIG. 4c, a photoresist area 50 is shown defined by the perimeter line 48.

Using the remaining polysilicon coating and thin oxide 36 as a diffusion mask, the slice is now subjected to an N+ diffusion, whereby phosphorus is deposited and then diffused into the silicon slice 30 to produce the N+ regions 10, 13, 14, 15, etc. The depth of diffusion is about 8000 to 10,000A. The N+ diffused regions function as conductors which connect the various regions together, and also function as the source or drain regions of all the exposed polysilicon areas such as gates 17 and 21, the line 29, etc. In the poly to moat contact areas 16 and 22, and at a contact area 41 between the strip 40 and the Vdd line 15, the N+ diffusion penetrates the poly and converts the underlying P-type silicon to N+ because here the oxide layer 36 has been removed. The masks used to define these contact areas when the oxide coating 36 was removed are shown in FIG. 1 as dotted lines 51, 52, and 53. Again these are much larger than the actual contact areas to allow substantial misalignment.

As seen in FIG. 3d, fabrication of the device is continued by depositing a layer 39 of phosphorus-doped oxide. Rather than by oxidizing, this is done by a low temperature reaction process using conventional chemical vapor deposition techniques. A layer 39 of about 6000A is produced, covering the entire slice. This deposition is followed by a "densification" step wherein the slice is heated at 950° C for the purpose of eliminating minute holes or pores in the oxide. Subsequently, a photoresist operation opens windows in the oxide layer 39 in areas 12, 25 and 26 where contact is to be made from metal to the moat or from metal to the polysilicon layer (none seen in the illustrative embodiment). Then, a layer of aluminum is deposited on the entire slice, and etched away using photoresist masking to provide the desired pattern of metal interconnections 11, 23 and 24.

Figure 5A:
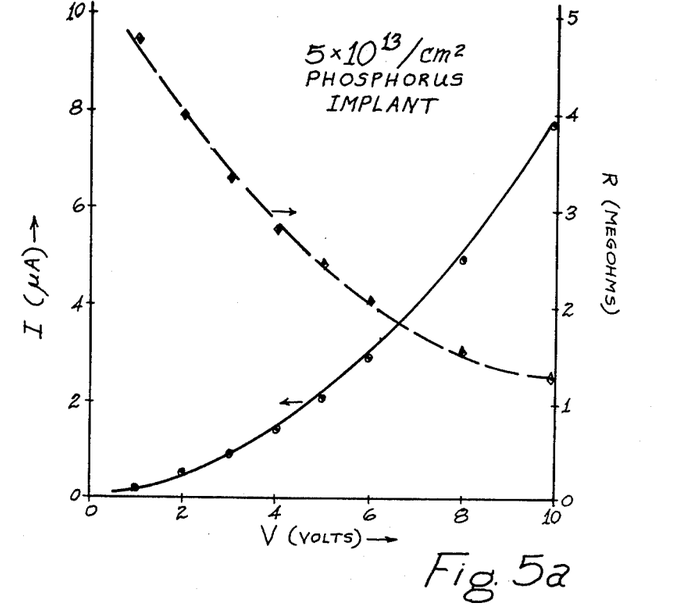
FIG. 5a–5d are graphic representations of current and resistance plotted as a function of voltage for a resistor according to the invention.
Figure 5B:
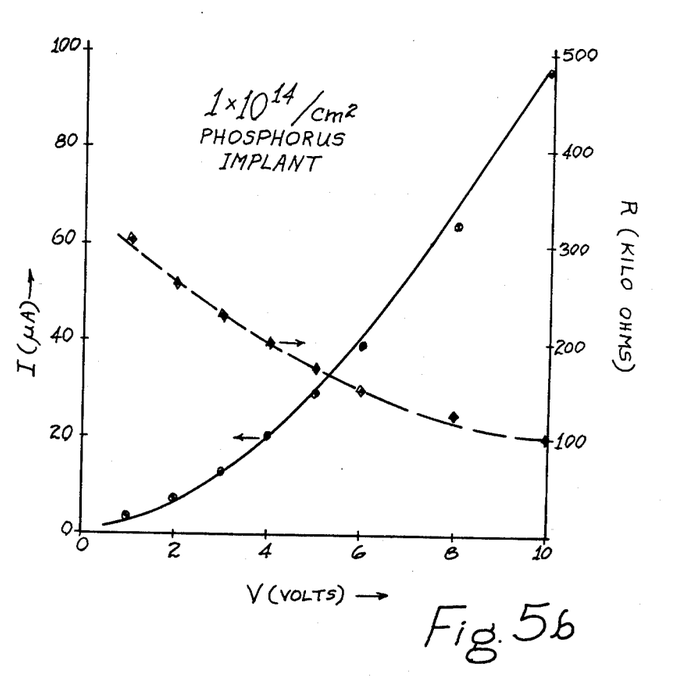
Figure 5C:
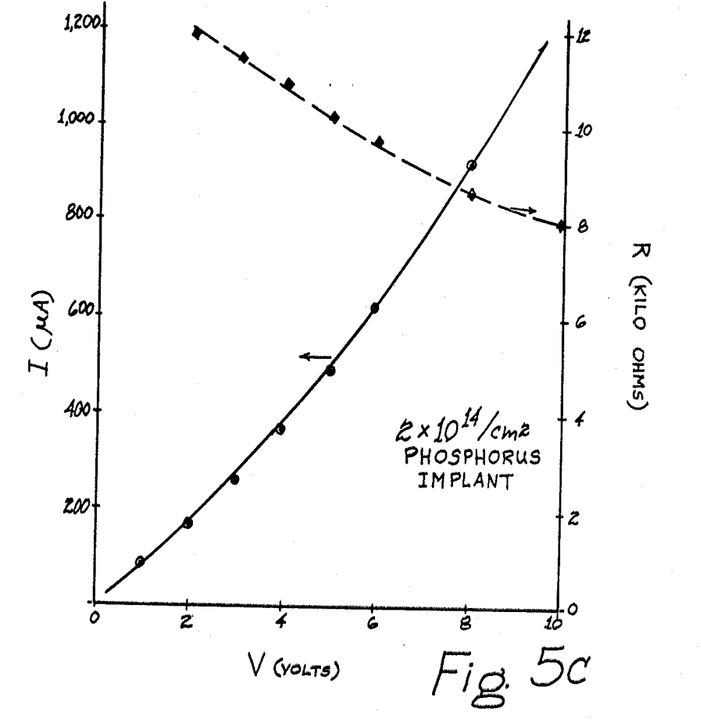
Figure 5D:
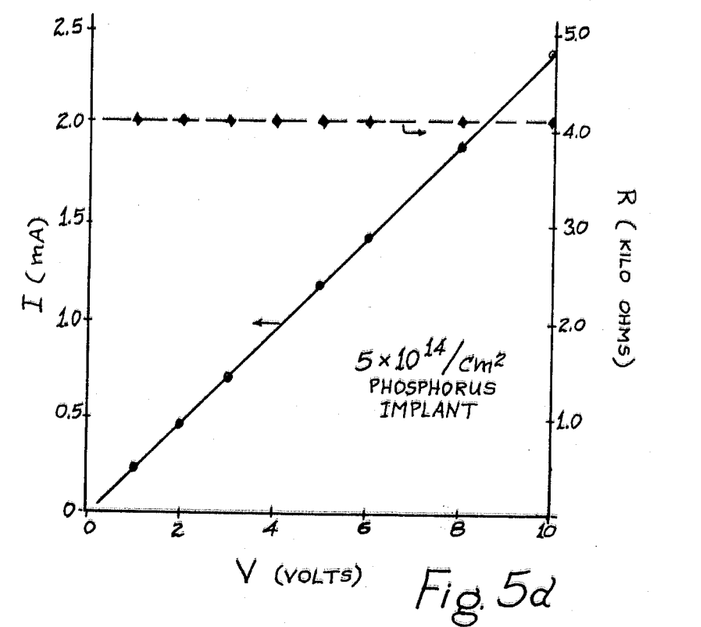
Figure 6:
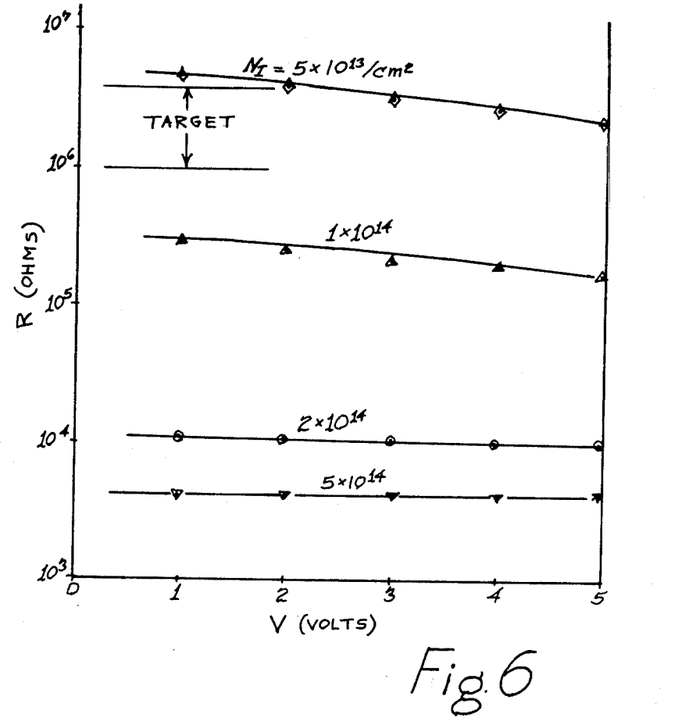
FIG. 6 is a graphic representation of resistance plotted as a function of voltage for various implant dosage levels.
Figure 7:
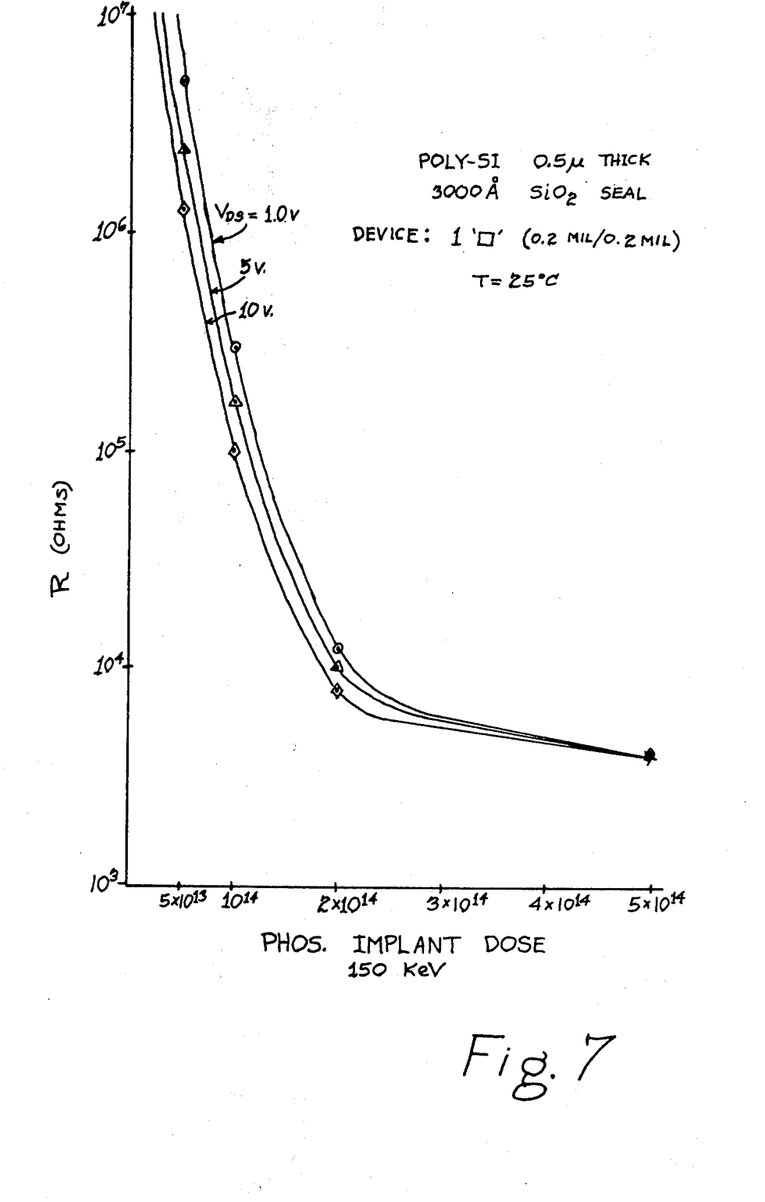
FIG. 7 is a graphic representation of resistance plotted as a function of phosphorus implant dosage.
Figure 8:
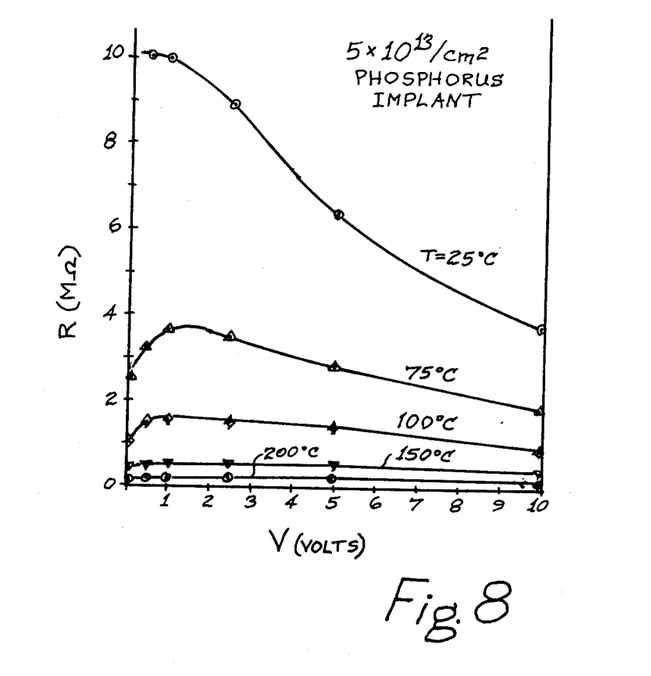
FIG. 8 is a graphic representation of resistance as a function of voltage for various operating temperatures.

With reference to FIGS. 5a to 5d, the current through a "one square" sample at 25° C is plotted as a function of voltage for resistors made according to the process described above, for phosphorus implantations at 150 KeV and four different dosages running from $5 \times 10^{13}$ in FIG. 5a to $5 \times 10^{14}$ in FIG. 5d. From V/I, the resistance and thus resistivity is obtained. The polysilicon thickness in this case is 0.5 micron. FIG. 6 is a summary of the data in FIGS. 5a to 5d, plotted on semi-log scale, as is FIG. 7 where resistance is plotted as a function of implant dosage. FIG. 8 shows the temperature dependence of the $5 \times 10^{13}$ sample; usually a temperature range of up to 100° C is more than adequate, so this sample maintains a resistance of over one megohm up to 100° C.

In an array of a large number of the cells of FIG. 1, the layout on the chip would make use of some economy of space by mirroring the cell about an axis 55 to define the cell on the right of the one shown, and mirroring the cell about the axis 56 to define the cell on the left. So, adjacent cells share the V$_{dd}$ line 15 and the contact area 41, as well as the contacts 25 and 26. Thus, the strip 40 of polysilicon becomes double the size shown, joined at the center at the contact 41. The moat 31 is also double, creating a continuous closed figure shared by two cells. An array of $2^{12}$ or 4096 cells would contain 64 rows and 64 columns of cells, but would require only 32 of the N+ of the diffused moat lines 15 and 2048 sets of the contacts 25 and 26; 64 of the access lines 29 would be needed, and 64 sets of the D and D data lines 23 and 24.

Although the invention has been described with reference to specific embodiments, the description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A resistor element for an N-channel, silicon-gate MOS integrated circuit of the type having field oxide surrounding transistor areas on the face of a semiconductor substrate, the transistor areas having gate oxide much thinner than the field oxide, comprising:
   a. an elongated strip of polycrystalline silicon extending across the field oxide and contacting at least one of the transistor areas,
   b. a resistor region in the elongated strip implanted with conductivity determining impurity to provide a selected resistivity less than that of undoped polycrystalline silicon,
   c. conductive regions in the elongated strip on both ends of the resistor regions, the conductive regions being doped at a level much higher than the resistor region.

2. A resistor element according to claim 1 wherein the resistor region is implanted with phosphorus at a dosage of about $5 \times 10^{13}$ to $1 \times 10^{14}$ atoms per cm$^2$ at 100 to 150 KeV.

3. A resistor element according to claim 2 wherein the polycrystalline silicon is no more than about 0.5 micron in thickness.

4. A resistor element according to claim 3 wherein a silicon oxide coating is provided on the resistor region.

5. In a static RAM cell of the type formed in a semiconductor integrated circuit having a semiconductor substrate, a pair of driver transistors formed in the substrate at one face thereof, a pair of load devices, first conductive means at said one face connecting each of the driver transistors in series with one of the load devices, second conductive means at said one face cross-coupling an output electrode of each driver transistor to a control electrode of the other driver transistor, the improvement wherein resistor elements providing said load devices comprise lightly-doped ion-implanted polycrystalline semiconductor material overlying an insulating coating on said one face said material being doped to a level which provides a selected resistivity less than that of undoped polycrystalline semiconductor and much greater than that of diffused semiconductor.

6. A device according to claim 5 wherein the resistor elements are phosphorus implanted.

7. A device according to claim 5 wherein the substrate is silicon and the driver transistors are surrounded on said one face by thermally-grown silicon oxide.

8. A device according to claim 7 wherein the first conductive means and the second conductive means comprise polycrystalline silicon which is heavily doped with phosphorus.

9. A device according to claim 8 wherein the first and second conductive means include an elongated continuous strip of silicon which extends from the control electrode of the driver transistor to the control electrode of the other driver transistor.

10. A device according to claims 9 wherein the driver transistors are N-channel silicon-gate MOS transistors.

11. A device according to claim 10 wherein the resistor elements are no greater than about 0.5 micron in thickness.

12. A device according to claim 11 wherein the resistor elements have an impurity concentration corresponding to an implant dosage of at least about $5 \times 10^{13}$ atoms per cm$^2$ and not more than about $10^{14}$ atoms per cm$^2$ at an energy level of at least about 100 KeV and not over about 150 KeV.

13. A device according to claim 12 wherein a protective coating is provided over the polycrystalline silicon of the resistor elements.

14. A device according to claim 13 wherein the protective coating is thermal silicon oxide or deposited silicon nitride.

15. A device according to claim 10 wherein the transistors are formed in a continuous moat along with a pair of data-input transistors.

16. A device according to claim 15 wherein the continuous moat forms a closed figure which additionally includes two driver transistors and two data-input transistors for an adjacent cell.

17. A device according to claim 16 wherein said elongated continuous strip of silicon is joined at a central location to another similar elongated continuous strip of polycrystalline silicon which provides resistor elements and conductive means as well as silicon gates for a different adjacent cell.

18. A resistor element for an integrated circuit comprising: an elongated thin strip of polycrystalline silicon having a resistor portion which is lightly doped and conductor portions which are heavily doped, the resistor portion being ion implanted to a concentration corresponding to a dosage of at least about $5 \times 10^{13}$ and not more than about $10^{14}$ phosphorus atoms per cm$^2$ at an energy level of at least about 100 KeV and not over about 150 KeV, the conductor portions being phosphorus diffused at a concentration many orders of magnitude greater than that of the resistor portions.

19. A device according to claim 18 wherein the strip of polycrystalline silicon is no more than about 0.5 micron in thickness.

20. A device according to claim 18 wherein the resistor portion is ion implanted to a concentration corresponding to a dosage of at least about $5 \times 10^{13}$ and not more than about $10^{14}$ phosphorus atoms per cm$^2$ at an energy level of at least about 100 KeV and not over about 150 KeV.

21. A device according to claim 20 wherein the conductor portions are phosphorus diffused at a concentration many orders of magnitude greater than that of the resistor portions.

* * * * *